United States Patent
Li et al.

(10) Patent No.: US 11,011,704 B2
(45) Date of Patent: May 18, 2021

(54) FORMING RRAM CELL STRUCTURE WITH FILAMENT CONFINEMENT

(71) Applicant: INTERNATIONAL BUSINESS MACHINES CORPORATION, Armonk, NY (US)

(72) Inventors: Juntao Li, Cohoes, NY (US); Dexin Kong, Guilderland, NY (US); Kangguo Cheng, Schenectady, NY (US); Takashi Ando, Tuckahoe, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/831,379

(22) Filed: Mar. 26, 2020

(65) Prior Publication Data

US 2020/0381621 A1    Dec. 3, 2020

Related U.S. Application Data

(63) Continuation of application No. 16/424,981, filed on May 29, 2019, now Pat. No. 10,658,583.

(51) Int. Cl.
*H01L 45/00* (2006.01)

(52) U.S. Cl.
CPC ...... *H01L 45/1253* (2013.01); *H01L 45/1233* (2013.01); *H01L 45/146* (2013.01); *H01L 45/1608* (2013.01)

(58) Field of Classification Search
CPC ............. H01L 45/1253; H01L 45/1233; H01L 45/146; H01L 45/1608
See application file for complete search history.

(56) References Cited

U.S. PATENT DOCUMENTS 7,167,387 B2 * 1/2007 Sugita ................ G11C 11/5685
                                                    257/37
7,960,216 B2    6/2011 Phatak
(Continued)

FOREIGN PATENT DOCUMENTS

WO    2016204420 A1    12/2016

OTHER PUBLICATIONS

Wong, "Metal-Oxide RRAM", Proceedings of the IEEE, vol. 100, No. 6, Jun. 2012, pp. 1951-1970.
(Continued)

*Primary Examiner* — Nikolay K Yushin
(74) *Attorney, Agent, or Firm* — Tutunjian & Bitetto, P.C.; Randall Bluestone

(57) ABSTRACT

A memory device with crossbar array structure includes two sets of parallel bottom electrodes positioned on a substrate. The lower bottom electrodes are located at a lower position relative to higher bottom electrodes. The device includes a first set of corner tips of the lower bottom electrodes, and a second set of corner tips at a top of the higher bottom electrodes. The device also includes a set of parallel top electrodes intersecting the two sets of parallel bottom electrodes. A dielectric is formed as a resistive random-access memory (RRAM) cell under each intersection of each top electrode and each of bottom electrode. The device further includes one set of contacts at one end of an array that contacts the lower bottom electrodes and another set of contacts at the other end of the array that contacts the higher bottom electrodes.

20 Claims, 16 Drawing Sheets

(56) References Cited

U.S. PATENT DOCUMENTS

| | | | |
|---|---|---|---|
| 8,030,635 B2 * | 10/2011 | Lung | H04L 45/04 |
| | | | 257/2 |
| 8,129,250 B2 | 3/2012 | Rossel et al. | |
| 8,309,946 B2 * | 11/2012 | Mitani | H01L 45/08 |
| | | | 257/5 |
| 8,853,713 B2 | 10/2014 | Marsh et al. | |
| 9,059,391 B2 | 6/2015 | Hou et al. | |
| 9,627,443 B2 * | 4/2017 | Jo | H01L 45/1226 |
| 9,805,793 B2 | 10/2017 | Rajamohanan et al. | |
| 9,847,480 B2 | 12/2017 | Tu | |
| 2010/0176362 A1 * | 7/2010 | Lung | G11C 13/0004 |
| | | | 257/2 |
| 2014/0312296 A1 * | 10/2014 | Jo | H01L 27/2418 |
| | | | 257/4 |

OTHER PUBLICATIONS

Hayakawa, "Highly Reliable TaOx ReRam with Centralized Filament for 28-nm Embedded Application", 2015 Symposium on VLSI Technology, Jun. 2015, 2 pages.

Niu, "Geometric Conductive Filament Confinement by Nanotips for Resistive Switching of HfO2-RRAM Devices with High Performance", Scientific Reports, May 2016, 9 pages.

List of IBM Patents or Patent Applications Treated as Related dated Mar. 26, 2020, 2 pages.

* cited by examiner

FORMING RRAM CELL STRUCTURE WITH FILAMENT CONFINEMENT

BACKGROUND

The present invention generally relates to semiconductor devices, and more particularly to resistive random-access memory, and methods of forming the same.

Resistive random-access memory (RRAM or ReRAM) is a non-volatile (NV) random-access memory (RAM). RRAM can be implemented for both classic memory applications and neuromorphic computing. In a RRAM, a memristor element (for example, hafnium oxide (HfOx)) is sandwiched between two electrodes. Defects (for example, oxygen vacancies) are intentionally introduced in the memristor film which can be programmed to different logic states such as a low-resistance state (logic "1") or a high-resistance state (logic "0") by changing the polarity of electrical field across the memristor element.

SUMMARY

In accordance with an embodiment of the present invention, a method for forming a memory device with confined filament is provided. The method includes forming at least one set of self-aligned corner tips of at least one set of bottom electrodes. The method further includes forming filaments at the at least one set of self-aligned corner tips, and depositing at least one set of top electrodes intersecting the bottom electrodes. A dielectric is formed as a resistive random-access memory (RRAM) cell under each intersection of each top electrode and each of bottom electrode. The method also includes depositing at least one set of contacts to contact the at least one set of electrodes.

In accordance with an embodiment of the present invention, a method for forming a memory device with a crossbar array structure is provided. The method includes forming two sets of parallel bottom electrodes on substrate. The lower bottom electrodes are located at a lower position relative to the higher bottom electrodes. The method includes forming a first set of corner tips of the lower bottom electrodes in a self-aligned manner, and a second set of corner tips at a top of the higher bottom electrodes. The method also includes depositing a set of parallel top electrodes intersecting the two sets of parallel bottom electrodes. A dielectric is formed as a resistive random-access memory (RRAM) cell under each intersection of each top electrode and each of bottom electrode. The method further includes depositing one set of contacts at one end of an array to contact the lower bottom electrodes and another set of contacts at the other end of the array to contact the higher bottom electrodes.

In accordance with an embodiment of the present invention, a memory device with confined filaments includes at least one set of bottom electrodes. The device includes at least one set of self-aligned corner tips formed at the corners of at least one set of bottom electrodes, and filaments formed at the at least one set of self-aligned corner tips. The device also includes at least one set of top electrodes intersecting the at least one set of bottom electrodes, wherein a dielectric is formed as a resistive random-access memory (RRAM) cell under each intersection of each top electrode and each of bottom electrode. The device further includes at least one set of contacts contacting the at least one set of electrodes.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
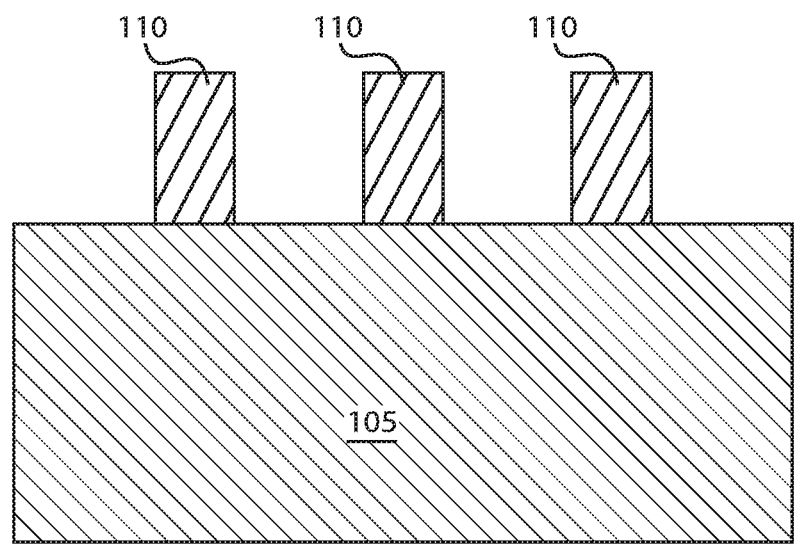
FIG. 1 is a top down and cross-sectional view showing hard mask layers on a substrate, in accordance with an embodiment of the present invention.

Embodiments of the present invention relate generally to forming resistive random access memory (RRAM) cells with increased density (for example, two times greater density) and a filament confinement function. The basic unit of information in filamentary-based resistive switching memories is physically stored in the conductive filament. The various embodiments described herein achieve reduced variability of switching characteristics by precisely controlling the location of the filament at the corner tips of the interactions between (for example, two) sets of bottom electrodes and (for example, one set of) top electrodes. This is achieved by enhancing the electric field at the tips during the electroforming process. The filament formed using the structure of the example embodiments is thereby formed in a precisely directed location, in contrast to incumbent methods in which the area of formation is (substantially) randomly determined.

Embodiments of the present invention also relate generally to forming cells with increased density (for example, two times greater density) within the same footprint area. Variability of switching characteristics is a serious concern for filament-type ReRAM devices (in which uniform switching characteristics are preferred). The variability is partly due to a random nature of filament formation. RRAM filament formation (for example, in materials such as $HfO_2$) is random, with the edge effects becoming more obvious due to reactive ion etching (RIE) damage to the RRAM pillar sidewall as cell sizes are scaled down. The example embodiments form a structure with a confined filament in the memory cell that focuses filament formation and thereby significantly reduces the (randomness and) variability of switching characteristics. In example embodiments, a structure (for example, a device) is fabricated in which the location of the filament is precisely controlled during operation of the finished device.

Exemplary applications/uses to which the present invention can be applied include, but are not limited to forming a RRAM structure that has significant benefits for reducing variability of switching characteristics, particularly applicable to small RRAM device structures where edge effects become obvious during filament formation. The example applications provide an increased density of memory cells per unit area. The example embodiments can double a number of memory cells in an area compared with incumbent processes.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer may be by one or more deposition processes, where, for example, a conformal layer can be formed by a first process (e.g., ALD, PEALD, etc.) and a fill can be formed by a second process (e.g., CVD, electrodeposition, PVD, etc.).

It should be noted that materials may be referred to only by their composition constituent, e.g., silicon, nitrogen, oxygen, carbon, hafnium, titanium, etc., without specifying a particular stoichiometry (e.g., SiGe, $SiO_2$, $Si_3N_4$, $HfO_2$, etc.) in recognition that the stoichiometry can vary based on formation processes, processing parameters, intentional non-stoichiometric fabrication, deposition tolerance, etc. Reference to only the composition constituents (e.g., SiO, SiN, TiN, etc.) is, therefore, intended to refer to all suitable stoichiometric ratios for the identified composition. In addition, other elements can be included in the compound and still function in accordance with the present principles. The compounds with additional elements will be referred to herein as alloys.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc.

It is to be understood that aspects of the present invention will be described in terms of a given illustrative architecture; however, other architectures, structures, substrate materials and process features and steps can be varied within the scope of aspects of the present invention.

It should be noted that certain features may not be shown in all figures for the sake of clarity. This is not intended to be interpreted as a limitation of any particular embodiment, or illustration, or scope of the claims.

FIGS. 1 to 17 collectively and sequentially illustrate an example embodiment of processes that may be implemented for forming RRAM cells with increased density and a confined filament. The processes described with respect to FIGS. 1 to 17 achieve this by precisely controlling the location of the filament at the corner tips of the interactions between the two sets of bottom electrodes and one set of top electrodes during the electroforming process.

Referring now to the drawings in which like numerals represent the same or similar elements and initially to FIG. 1, a top down and cross-sectional view showing hard mask layers on a substrate is illustrated.

As shown in FIG. 1, a device 100 can be formed from an initial structure that includes a substrate (for example, a dielectric layer) 105 with a (for example, hard) mask 110. For example, the process can start with bulk substrate 105 with an underlayer (with transistors and wirings) (not shown). A cross sectional view 102 of the initial structure is shown, with the mask 110 protruding above the substrate 105.

The substrate 105 may be selected from the group consisting of silicon-containing materials such as $SiO_2$, $Si_3N_4$, SiOxNy, SiC, SiCO, SiCOH, and SiCH compounds; the above-mentioned silicon-containing materials with some or all of the Si replaced by Germanium; carbon-doped oxides; inorganic oxides; inorganic polymers; hybrid polymers; organic polymers such as polyamides; other carbon-containing materials; organo-inorganic materials such as spin-on glasses and silsesquioxane-based materials; and diamond-like carbon (DLC, also known as amorphous hydrogenated carbon, a-C:H).

The substrate 105 may be formed by, for example, various methods such as spinning from solution, spraying from solution, chemical vapor deposition (CVD), plasma enhanced CVD (PECVD), sputter deposition, reactive sputter deposition, ion-beam deposition, and evaporation, etc.

The mask 110 can be formed on a surface of the substrate 105. The mask 110 can include soft and/or hardmask materials and can be formed using deposition, photolithography and etching. In one embodiment, the mask 110 can be a hardmask. For example, the mask 110 can include a nitride-containing material, such as, e.g., a silicon nitride material (e.g., SiN, a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof). However, the mask 110 can include any suitable dielectric material that can be deposited by, e.g., chemical vapor deposition (CVD) and related methods. Other compositions for the mask 110 include, but are not limited to, silicon oxides, silicon carbides, etc. Spin-on dielectrics that can be utilized as a material for the mask 110 can include, but are not limited to: silsequioxanes, siloxanes, and boron phosphate silicate glass (BPSG).

Figure 2:
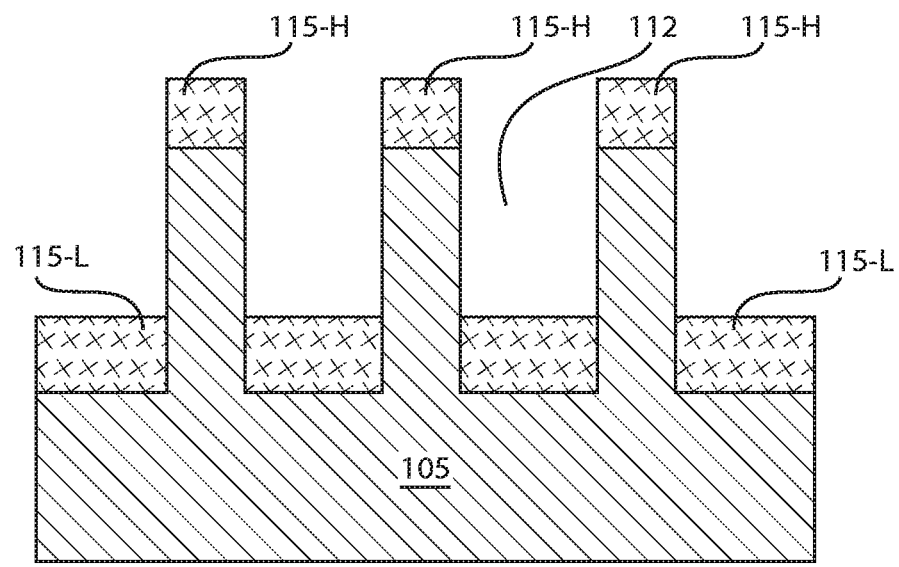
FIG. 2 is a cross-sectional view of patterned electrodes, in accordance with an embodiment of the present invention.

FIG. 2 illustrates a perspective and cross-sectional view 104 of patterned electrodes, in accordance with example embodiments.

Dielectric trenches 112 are patterned into the substrate 105, for example, by patterning, for example applying RIE (to exposed portions of the substrate 105 while) using the mask 110. Concurrently, ridges are formed at the positions of the mask layers 110. The patterning mask 110 is thereafter removed (for example, stripped, etc.).

Non-conformal bottom electrode metal deposition is performed on device 100, resulting in thicker film on horizontal surfaces and a thinner film on vertical surfaces (for example, the vertical walls of the ridges). Lower bottom electrodes 115-L are (thereby) deposited on the recessed surface of the device 100 (e.g., within the trenches 112). Higher bottom electrodes 115-H are (thereby) deposited on the higher surface of the device 100 (e.g., portions of the upper surface of the substrate 105 that were protected by the mask 110 during patterning). The bottom electrodes 115 can include any suitable material in accordance with the embodiments described herein. Examples of suitable materials that can be included in the bottom electrodes 115 include, but are not limited to, titanium-based materials (e.g., titanium nitride materials (e.g., TiN)), tantalum-based materials (e.g., tantalum nitride materials (e.g., TaN)), and tungsten-based materials (e.g., W). The bottom electrodes 115 may be composed of one uniform material.

The bottom electrode material is etched back to remove metal from vertical surfaces, leaving metal on horizontal surfaces. According to an example embodiment, after each deposition, excess material can be planarized and/or recessed from the semiconductor device with a suitable etch or planarization process.

Figure 3:
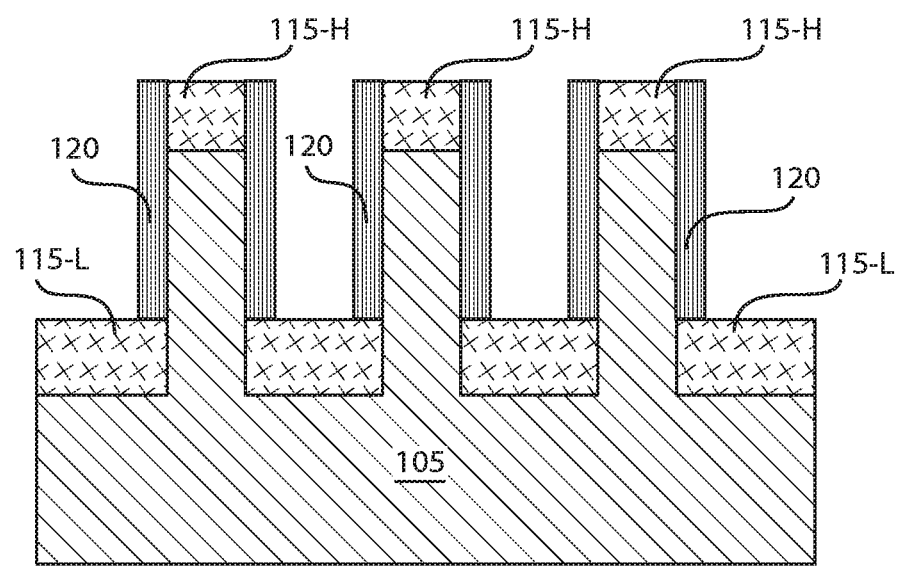
FIG. 3 is a cross-sectional view showing of forming sidewall spacers, in accordance with an embodiment of the present invention.

FIG. 3 is a cross-sectional view showing of forming sidewall spacers, in accordance with example embodiments.

Sidewall spacers 120 are formed by etch back of a sidewall spacer layer 120 that is deposited along the (for example, vertical) sides of the dielectric trenches 112. The sidewall spacer layer 120 can be conformally formed along the sidewalls of the stack. For example, the sidewall spacer layer 120 can be deposited conformally by using ALD or CVD process. The sidewall spacer layer 120 can include any suitable dielectric material in accordance with the embodiments described herein. In one embodiment, the sidewall spacer layer 120 can include a low-k dielectric material. Examples of suitable dielectric materials for the sidewall spacer 120 include, but are not limited to, oxides, nitrides and/or oxynitrides.

Figure 4:
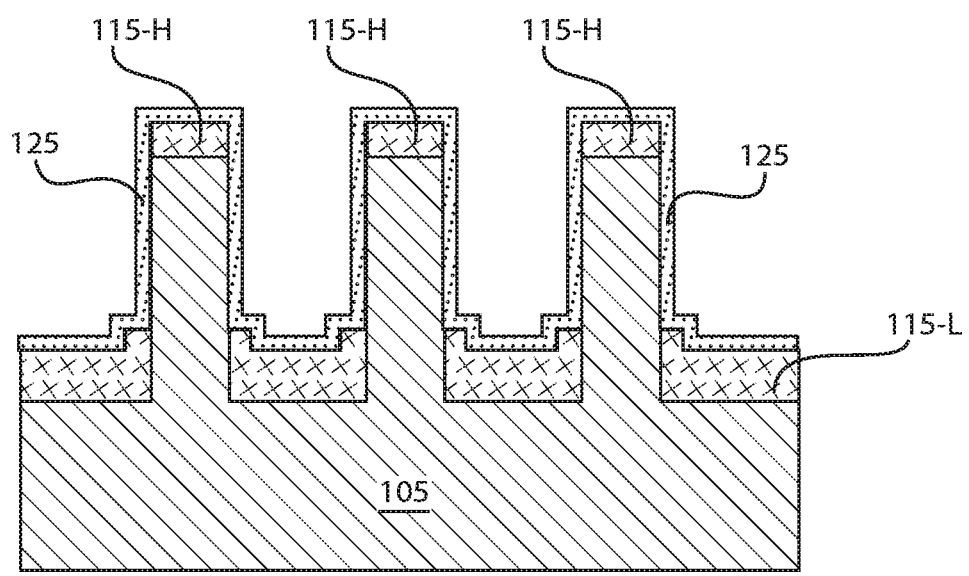
FIG. 4 is a cross-sectional view showing sidewall spacer pull and addition of a top layer, in accordance with an embodiment of the present invention.

FIG. 4 is a cross-sectional view showing sidewall spacer pull and addition of a top layer, in accordance with example embodiments.

The bottom electrodes 115 (both higher bottom electrodes 115-H and lower bottom electrodes 115-L) are recessed. The sidewall spacers 120 are then removed (for example, pulled back). In various embodiments, a sidewall spacer etch can be performed to remove the sidewall spacers 120. Any suitable etch process can be used to perform the sidewall spacer etch in accordance with the embodiments described herein.

In various example embodiments, (for example, conformal) first dielectric layers 125 (for example, high-k dielectric layers) are formed on the surface of the device including over (the exposed portions of) the higher bottom electrodes 115-H and lower bottom electrodes 115-L, and the (exposed portions of the) substrate 105. The switching material of the high-k dielectric layers 125 continuously covers the trenches 112 and the bottom electrodes 115.

A dielectric layer 125 can be deposited by any suitable techniques, such as, e.g., ALD, CVD, metal-organic CVD (MOCVD), physical vapor deposition (PVD), thermal oxidation, combinations thereof, or other suitable techniques. In one embodiment, a high-k material can be employed. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), etc. The high-k material may further include dopants such as lanthanum, aluminum, magnesium, or combinations thereof.

Figure 5:
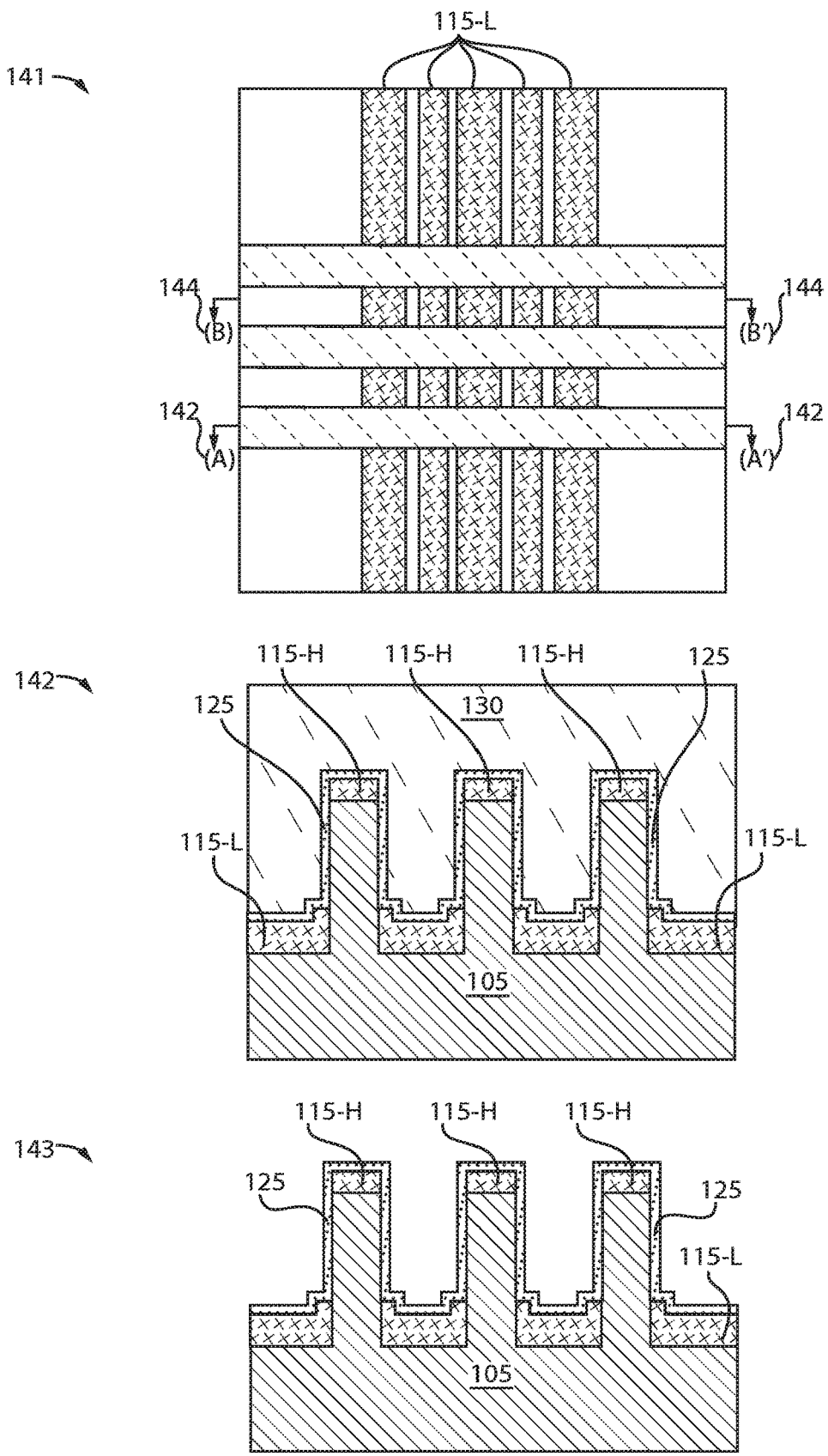
FIG. 5 is a top down and cross-sectional views showing deposit of a top electrode with patterning to form top electrode strips, in accordance with an embodiment of the present invention.

FIG. 5 is a top down and cross-sectional views showing deposit of a top electrode with patterning to form top electrode strips, in accordance with example embodiments.

Top metal electrode 130 material is deposited on the structure of FIG. 4 and planarization, for example CMP, is applied.

In non-limiting exemplary embodiments, top electrode 130 material deposition is performed on the upper surface of the structure. Top electrode 130 may include, but are not limited to, conductive materials such as titanium-based materials (e.g., titanium (Ti), titanium nitride materials (e.g., TiN)) and/or Al (aluminum)-containing alloys, and Tungsten (W). The top electrode 130 deposition is followed by planarization, for example, CMP. The top electrode 130 material is patterned (for example, via RIE) to form top electrode strips, stopping on the high-k dielectric layers 125.

The top down view 141 of the resulting structure illustrates orthogonal wordlines (top electrode strips (for example, stripes along the AA' cross-sectional view 142)) and two sets of bitline(s) (higher bottom electrodes 115-H and lower bottom electrodes 115-L along the BB' cross-sectional view 143). The horizontal high-k dielectric layers 125 are skipped (for example, left, not etched or patterned, etc.). The first high-k dielectric layers 125 are positioned (for example, formed, deposited, etc.) between each wordline and bitline. The (for example, sharp) corners between top electrodes and bottom electrodes (as will be discussed herein below in further detail with respect to FIG. 17) are the (preferred and implemented) location for filament formation.

FIGS. 6 to 17 collectively and sequentially illustrate an example embodiment of (sub) processes that may be implemented for forming contacts to wordlines and bitlines. FIGS. 6 to 15 provide an example implementation of a process that (overcomes difficulty to) form contacts to higher bottom electrodes 115-H and lower bottom electrodes 115-L, which are located next to each other with, for example, half (½) of minimal pitch. Directly forming contacts to higher bottom electrodes 115-H and lower bottom electrodes 115-L is not feasible as a contact formed in this manner would be below the minimal pitch and thus would cause electrical shorts in the resulting semiconductor device. The example embodiments form two sets of contacts, which include one set at one end of the array to contact higher bottom electrodes 115-H and the other set at the other end of array to contact lower bottom electrodes 115-L. Accordingly, each set of bitline contacts can be formed at minimal pitch in a self-aligned manner (thereby reducing significantly the probability of electrical shorts in the resulting semiconductor device). According to an example embodiment, structures are self-aligned when one structure is forced into a specific position relative to the other for a lithographically defined position.

Figure 6:
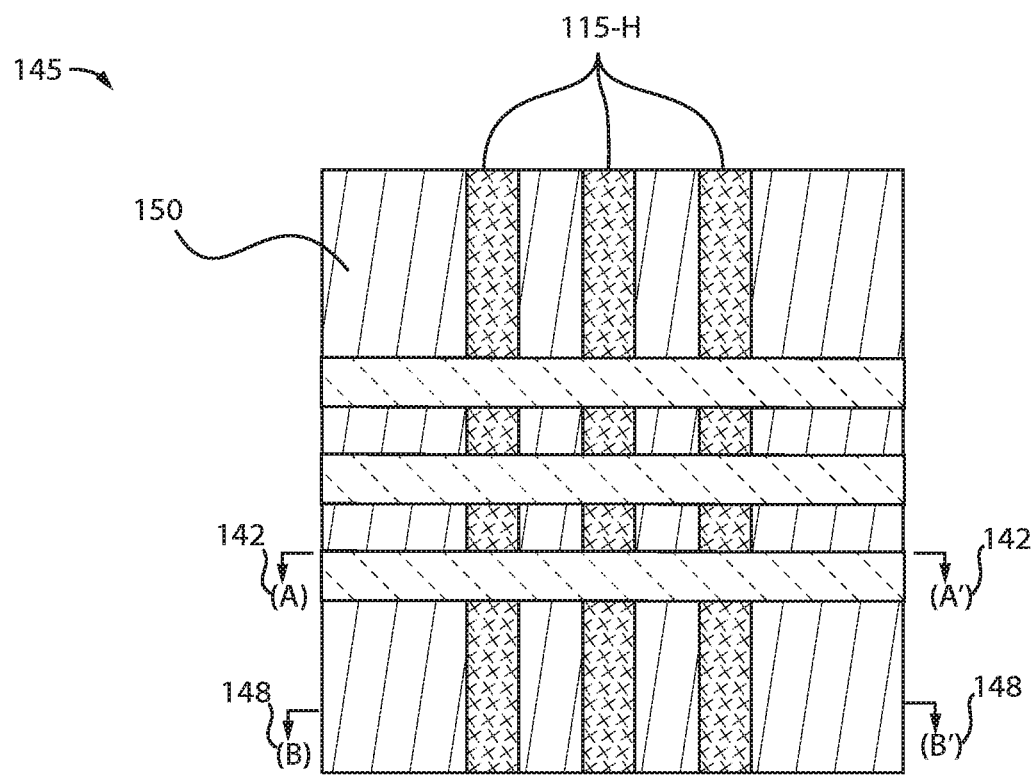
FIG. 6 is a top down and cross-sectional view showing first interlayer dielectric deposition (ILD) deposit and recess of first ILD material to expose electrodes, in accordance with an embodiment of the present invention.
Figure 6:
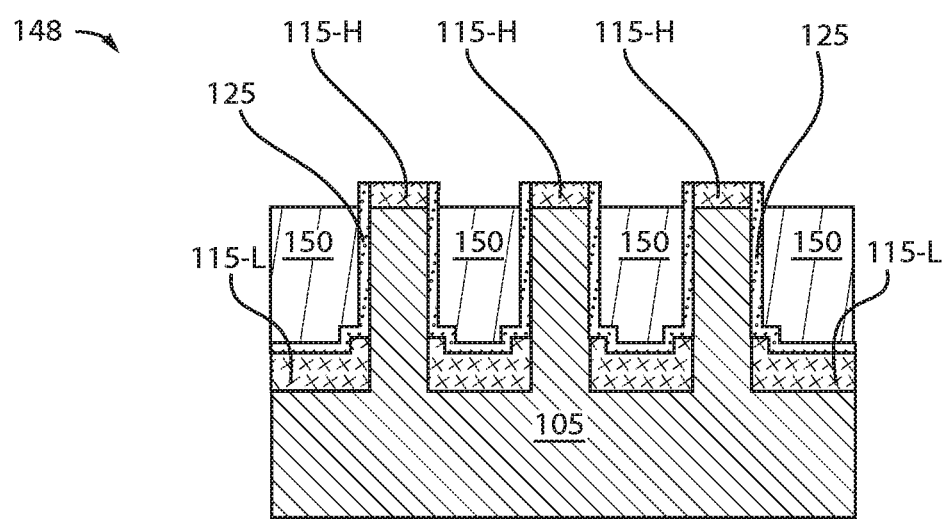

FIG. 6 is a top down and cross-sectional view showing first interlayer dielectric deposition (ILD) deposit and recess of first ILD material to expose electrodes, in accordance with example embodiments.

The top down view 145 shows a first ILD 150 material layer that is deposited with planarization, for example, CMP. The first ILD 150 can be formed in the trenches (to the sides of top electrodes 130, which are arranged in the AA' cross-sectional view 142, such as described and illustrated herein above with respect to FIG. 5) over the surface of first high-k dielectric layers 125. The first ILD 150 material is recessed to expose the higher bottom electrodes 115-H. The exposed horizontal high-k dielectric layers 125 are removed (for example, etched, pulled back, etc.).

The first ILD 150 can include any materials known in the art, such as, for example, porous silicates, carbon doped oxides, silicon dioxides, silicon nitrides, silicon oxynitrides, or other dielectric materials. The first ILD 150 can be formed using any method known in the art, such as, for example, chemical vapor deposition, plasma enhanced chemical vapor deposition, atomic layer deposition, or physical vapor deposition.

The BB' cross-sectional view 148, as shown in FIG. 6, includes the first ILD 150 formed (for example, positioned, deposited and etched back, etc.) in the trenches 112 over the high-k dielectric layers 125. The high-k dielectric layers 125 are formed to the vertical sides of the higher bottom electrodes 115-H and over the lower bottom electrodes 115-L.

Figure 7:
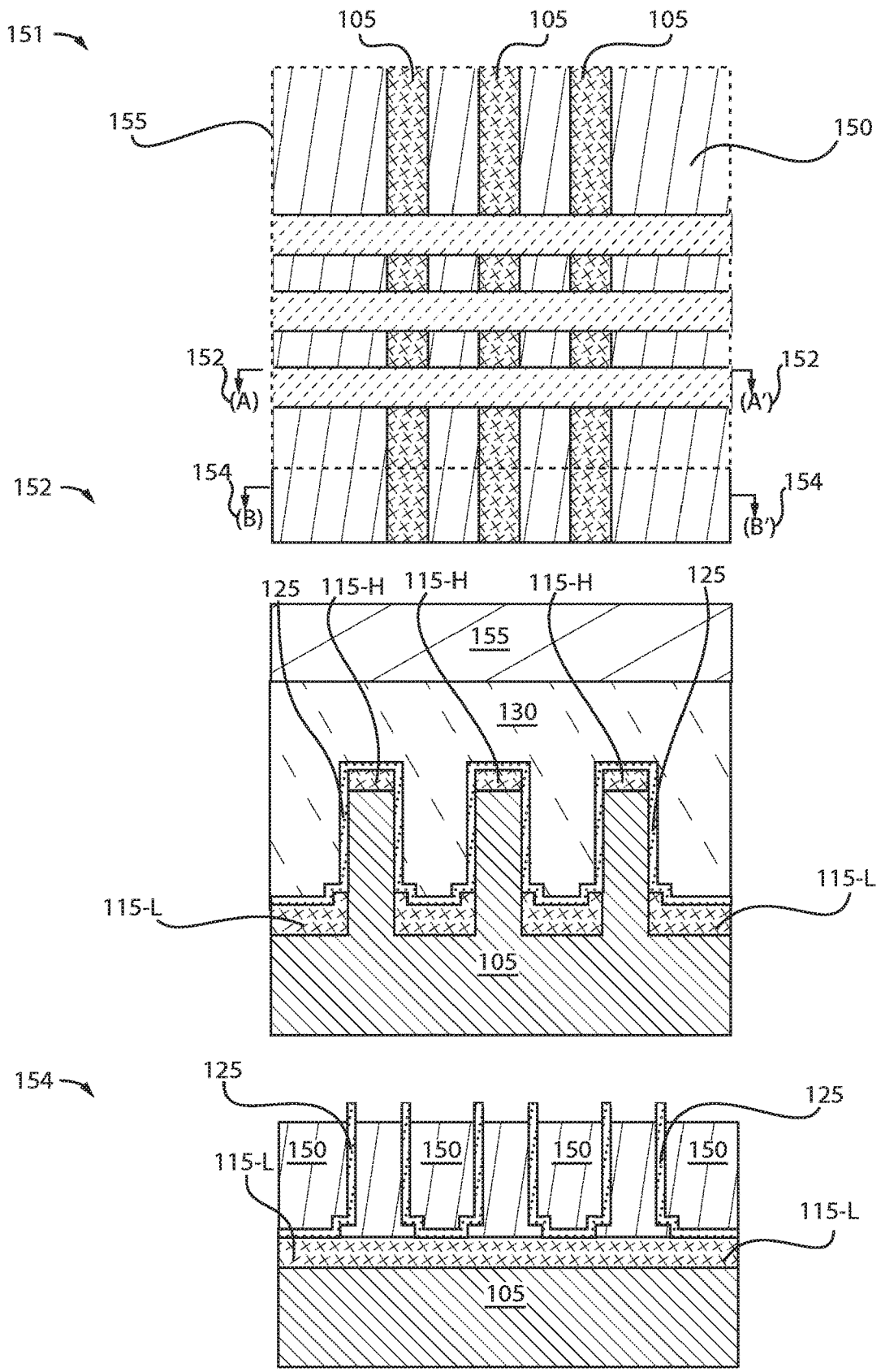
FIG. 7 is a top down and cross-sectional views showing a patterning block mask and removal of exposed bottom electrode, in accordance with an embodiment of the present invention.

FIG. 7 is a top down and cross-sectional views showing a patterning block mask and removal of exposed bottom electrode, in accordance with example embodiments.

The top down view 151 shows a patterning block mask 155 that is positioned (for example, deposited, applied, formed on, etc.) to the structure of FIG. 6 described herein above. As shown, the patterning block mask 155 is illustrated with a transparent view so that the underlying wordlines and bitlines can be seen.

The AA' cross-sectional view 152, as shown in FIG. 7, illustrates that the block mask 155 is positioned (for example, formed, deposited, etc.) on the upper surface of the top electrode 130.

The BB' cross-sectional view 154, as shown in FIG. 7, illustrates that RIE is performed to remove exposed higher bottom electrodes 115-H. As shown, exposed higher bottom electrodes 115-H are removed from the stack that includes the substrate 105 within the first high-k dielectric layers 125. The first high-k dielectric layers 125 remain.

Figure 8:
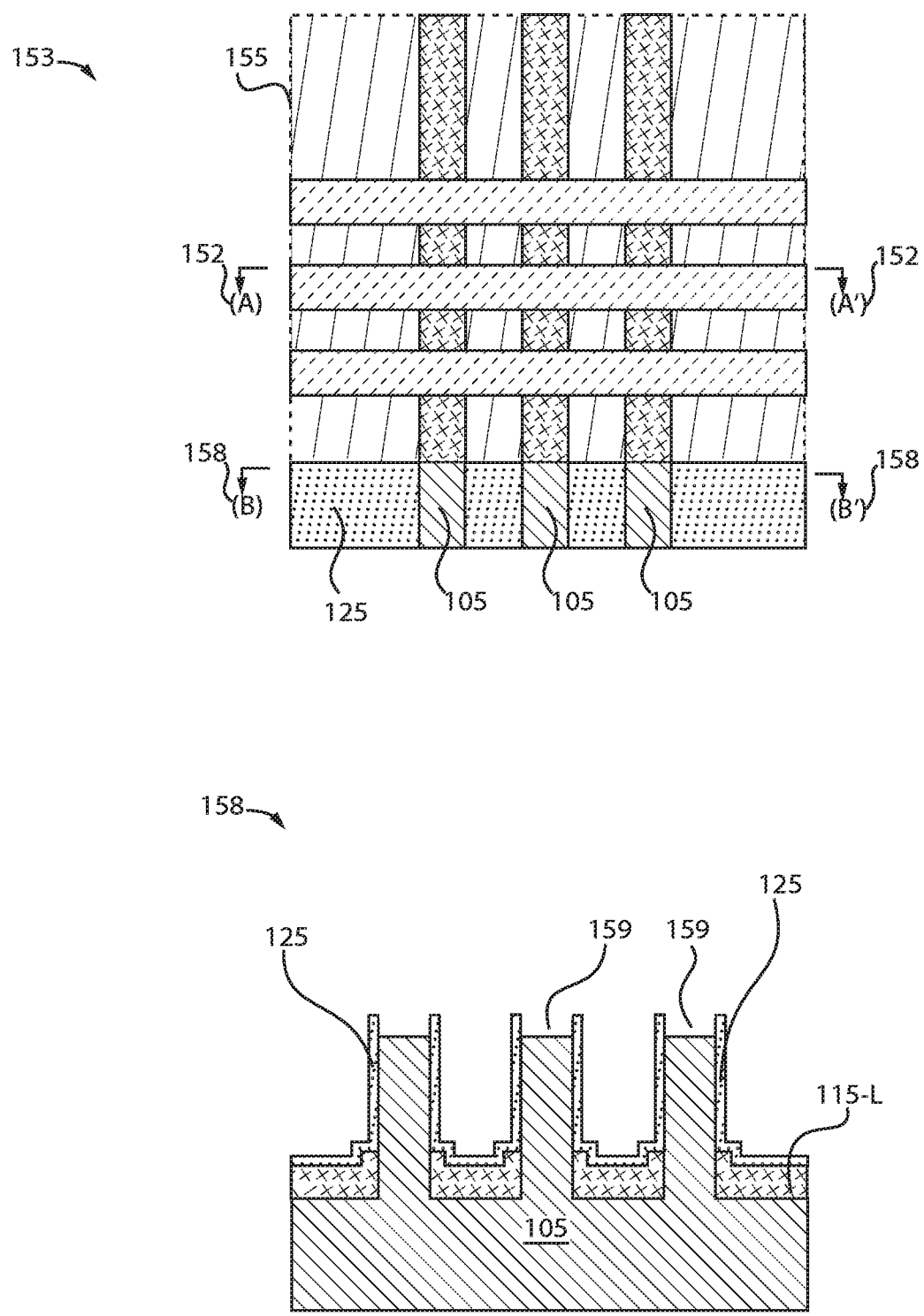
FIG. 8 is a cross-sectional and top down view showing removal of an exposed first ILD layer, in accordance with an embodiment of the present invention.

FIG. 8 is a cross-sectional and top down view showing removal of an exposed first ILD layer, in accordance with example embodiments.

The top down view 151 shows that the patterning block mask 155 remains over the portions of the device as described with respect to FIG. 7 herein above. The AA' cross-sectional view 152, such as described and illustrated herein above with respect to FIG. 7, remains the same. However, RIE is performed (along the BB' cross-sectional view 158) to remove the exposed first ILD 150 layer. As shown along the BB' cross-sectional view 158, the first high-k dielectric layers 125 are formed along the vertical sides of the underlayer (substrate 105). A space 159 is formed at the top of the substrate 105 between the first high-k dielectric layers 125 where the exposed higher bottom electrodes 115-H have been removed.

Figure 9:
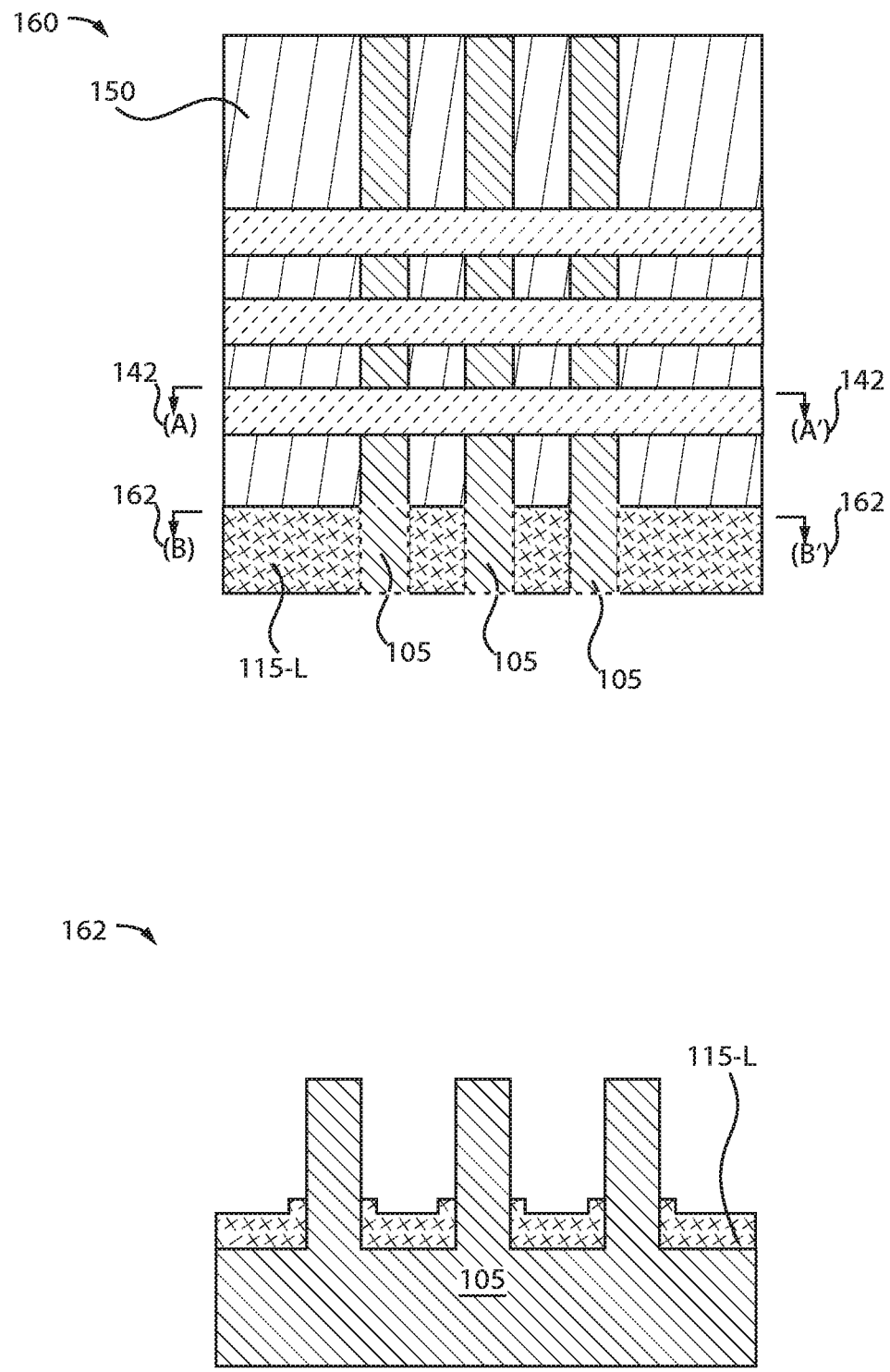
FIG. 9 is a cross-sectional and top down view showing removal of exposed top dielectric layer and stripping of block mask, in accordance with an embodiment of the present invention.

FIG. 9 is a cross-sectional and top down view showing removal of exposed top dielectric layer and stripping of block mask, in accordance with example embodiments.

The process continues with stripping of the block mask 155. The top down view 160 shows that the patterning block mask 155 has been removed from over the portions of the device described with respect to FIG. 8 herein above. After the patterning block mask 155 has been removed, the AA' cross-sectional view 142 is similar (or the same) as described and illustrated herein above with respect to FIG. 5.

The BB' cross-sectional view 162 illustrates that the exposed first high-k dielectric layers 125 (which were exposed by removing the exposed first ILD 150 layer as described with respect to FIG. 8) are removed (for example, via RIE, etc.). As shown, the substrate 105 forms columns (or ridges) protruding through and above the lower bottom electrodes 115-L.

Figure 10:
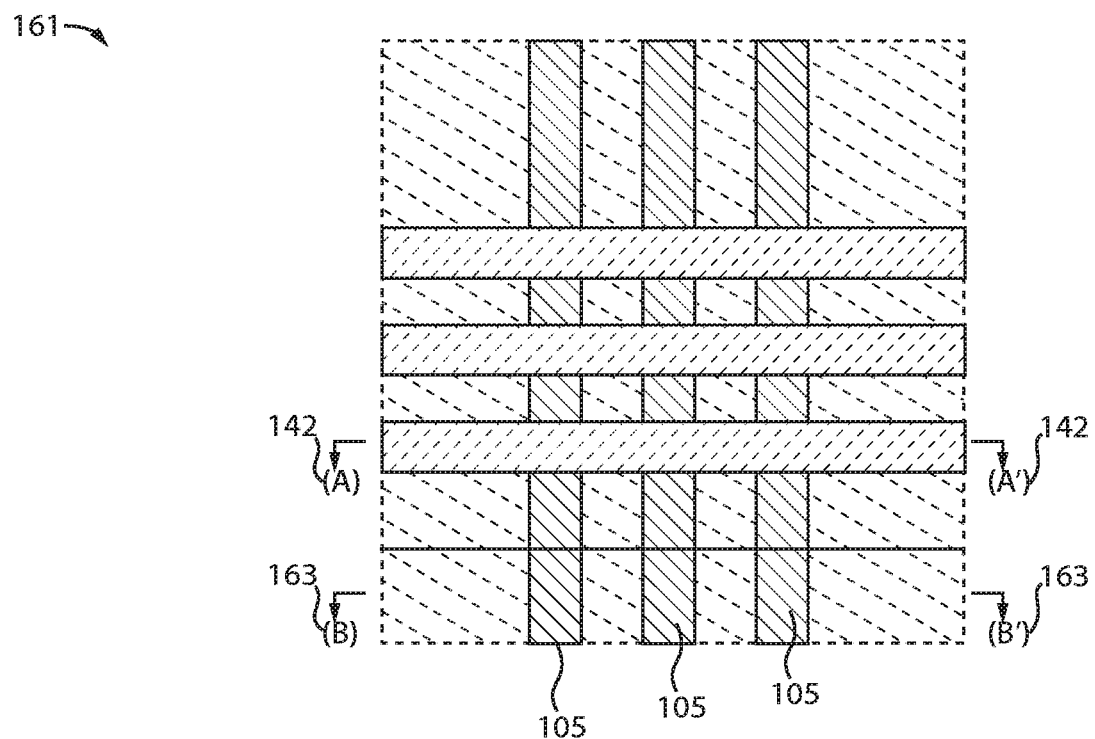
FIG. 10 is a cross-sectional and top down view deposit of a second ILD layer, in accordance with an embodiment of the present invention.
Figure 10:
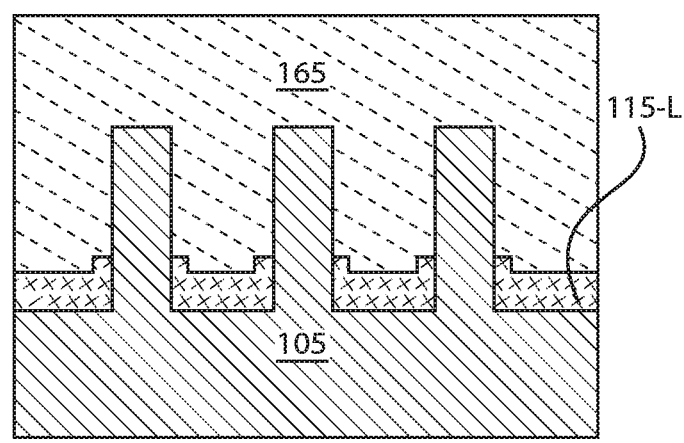

FIG. 10 is a cross-sectional and top down view deposit of a second ILD layer, in accordance with example embodiments.

A second ($2^{nd}$) ILD 165 layer is deposited on the structure of FIG. 9 with planarization, for example using CMP. The top down view 161 shows a transparent view through the second ILD 165 to the wordlines and bitlines below. AA' cross-sectional view 142 is similar (or the same) as described and illustrated herein above with respect to FIG. 5. The second ILD 165 fills up the gap between the patterned first ILD 150, and then CMP (or other planarization process) is performed on the second ILD 165 stopping on the first ILD 150. The second ILD 165 deposited on first ILD 150 is therefore polished away at this location (for example, cross-section 142).

The second ILD 165 can be formed over the surface of the substrate 110 and the lower bottom electrodes 115-L. As shown in the BB' cross-sectional view 163, the second ILD 165 surrounds and is deposited to a level above the substrate 105 columns.

Figure 11:
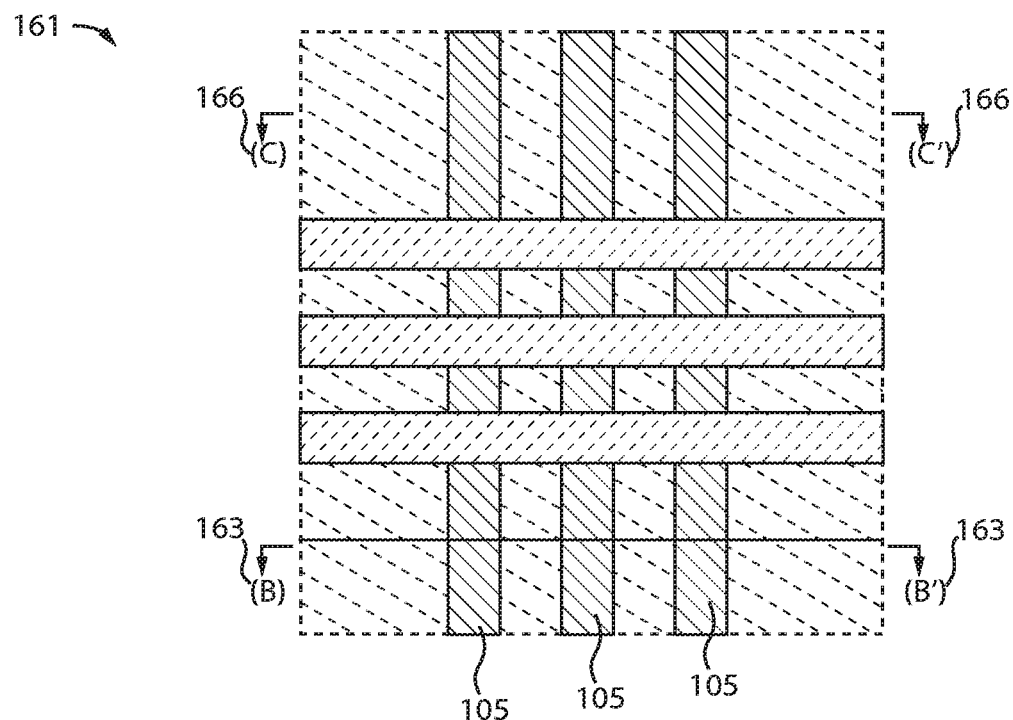
FIG. 11 is an additional top down and cross-sectional views showing the structure of FIG. 9, in accordance with an embodiment of the present invention.
Figure 11:
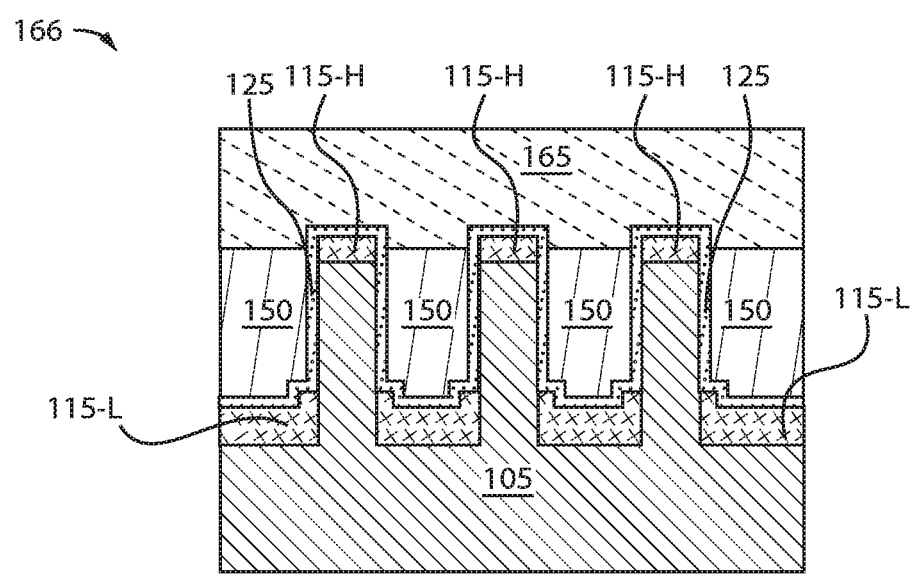

FIG. 11 is an additional top down and cross-sectional views showing the structure of FIG. 9, in accordance with example embodiments.

As shown in FIG. 11, the top down view 161 shows a transparent view through the second ILD 165 to the wordlines and bitlines below, along with additional cross-sectional views.

CC' cross-sectional view 166 shows that the second ILD 165 is formed over the first ILD 150 and the first high-k dielectric layers 125. The higher bottom electrodes 115-H and lower bottom electrodes 115-L and substrate 105 are below the first high-k dielectric layers 125. BB' cross-sectional view is the same as described with respect to FIG. 10 herein above.

Figure 12:
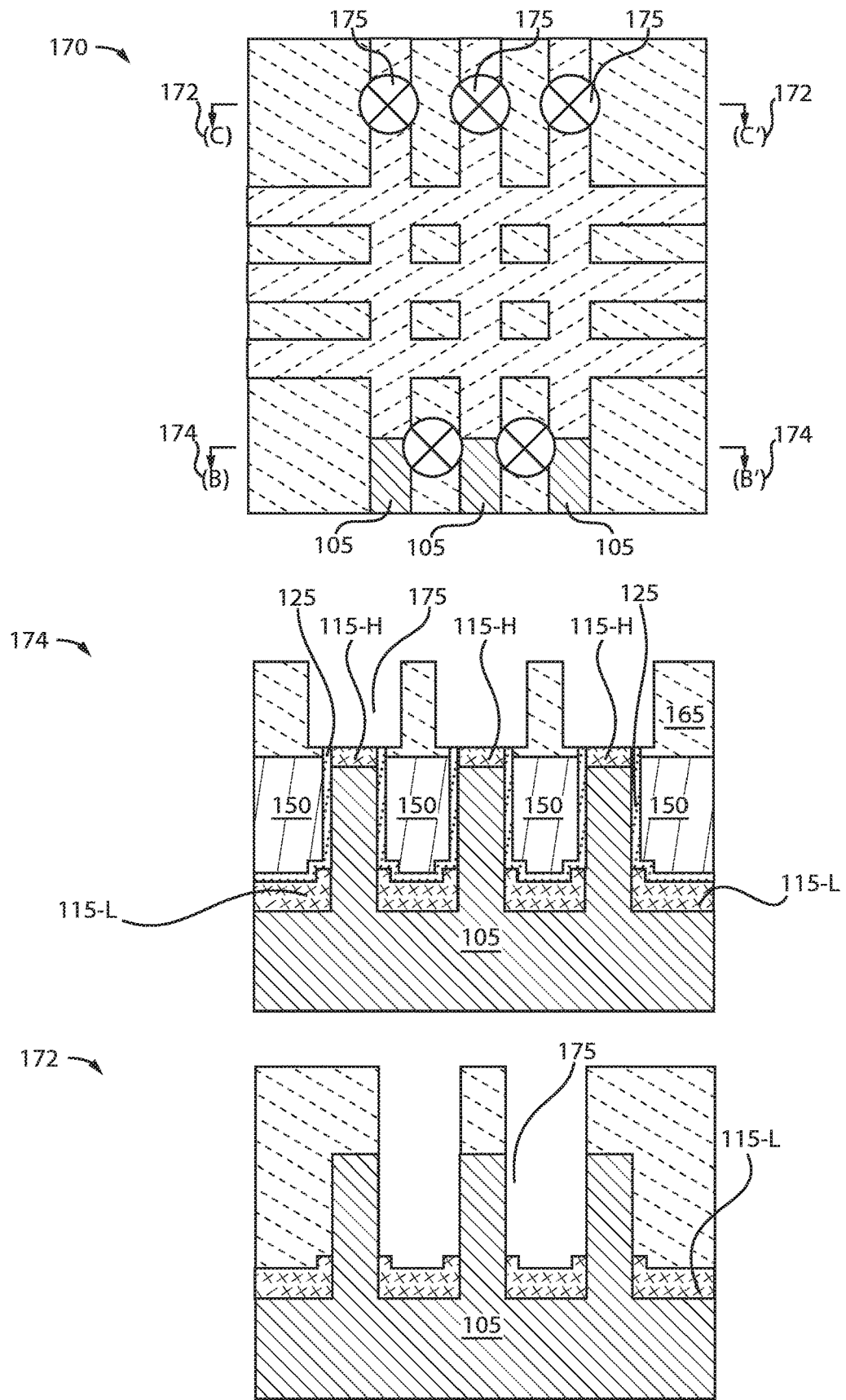
FIG. 12 is a top down and cross-sectional views showing patterning of contacts to the electrodes, in accordance with an embodiment of the present invention.

FIG. 12 is a top down and cross-sectional views showing patterning of contacts to the electrodes, in accordance with example embodiments.

The top down view 170 illustrates patterned contacts 175 that are formed through vias to higher bottom electrodes 115-H and lower bottom electrodes 115-L. A VIA is an electrical connection between layers in a physical electronic circuit that goes through the plane of one or more adjacent layers. The RIE etch process for forming contact to higher bottom electrodes 115-H and lower bottom electrodes 115-L is self-aligned.

CC' cross-sectional view 172 shows that a portion of the second ILD 165 is removed to expose the first high-k dielectric layers 125 and the higher bottom electrodes 115-H and to form the patterned contacts 175. The second ILD 165 covers the first ILD 150 in this view.

BB' cross-sectional view 174 shows that the second ILD 165 is removed to form patterned contacts 175.

Figure 13:
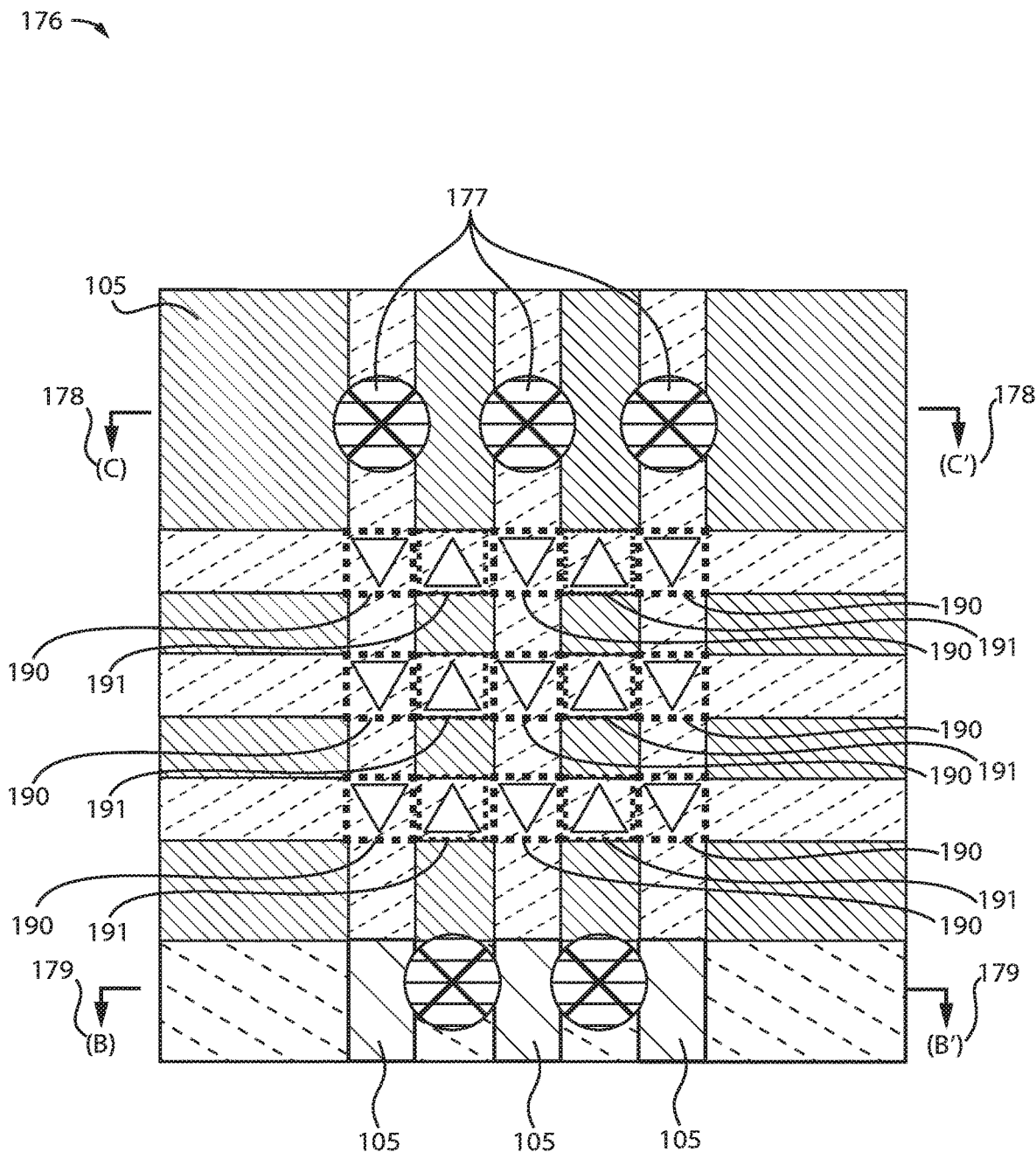
FIG. 13 is a top down view showing deposit of contacts, in accordance with an embodiment of the present invention.

FIG. 13 illustrates a top down view showing deposit of contacts, in accordance with example embodiments.

The top down view 170 illustrates the structure of FIG. 12, described herein above, when a contact 177 (for example, a conducting material such as metal, poly Si, or silicide, etc.) is deposited (and CMP is performed on the contact 177).

Each dashed box 190, 191 represents one RRAM cell. The RRAM cell 190 is formed between higher bottom electrodes 115-H and top electrodes 130, and the RRAM cells 191 are between lower bottom electrodes 115-L and top electrodes 130, respectively. The RRAM cells 190, 191 are arranged in an alternating manner (for example, cell 190, cell 191, cell 190, cell 191, etc.) when approached in the direction of the cross sectional perspective (and along the length of the top electrode 130), such as CC' cross-sectional view 178 and BB' cross-sectional view 179, and in alternate parallel planes (for example, cell 190, cell 190, cell 190 in one plane and cell 191, cell 191, cell 191 in the other plane) when approached from the perpendicular direction.

Figure 14:
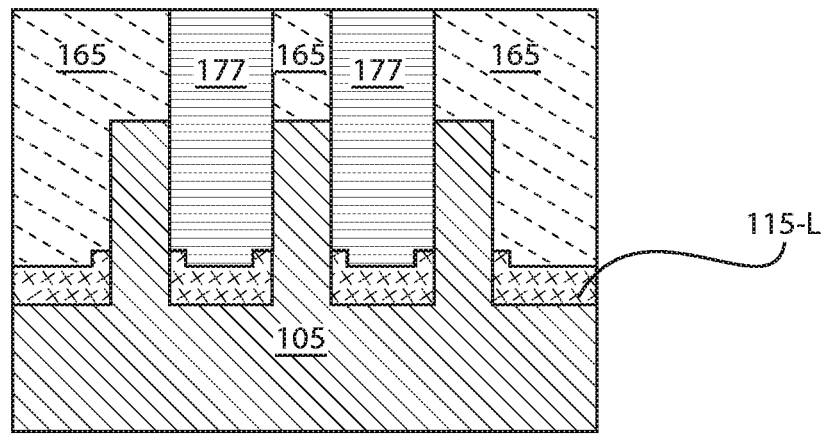
FIG. 14 are cross-sectional views showing deposit of contacts, in accordance with an embodiment of the present invention.
Figure 14:
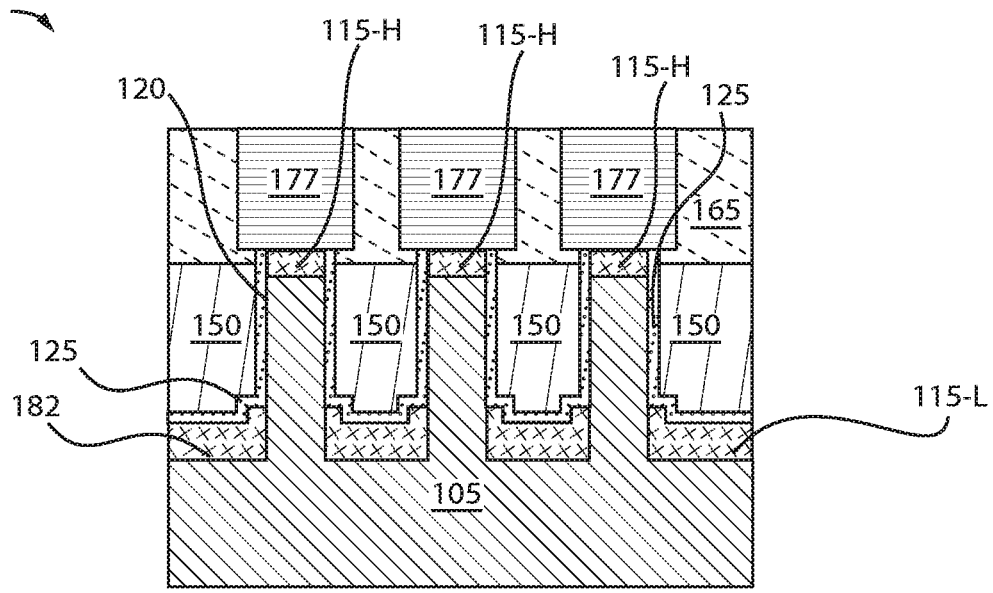

FIG. 14 illustrates cross-sectional views showing deposit of contacts, in accordance with example embodiments.

As shown in FIG. 14, the CC' cross-sectional view 178 and BB' cross-sectional view 179 include contacts 177 formed at different levels.

Figure 15:
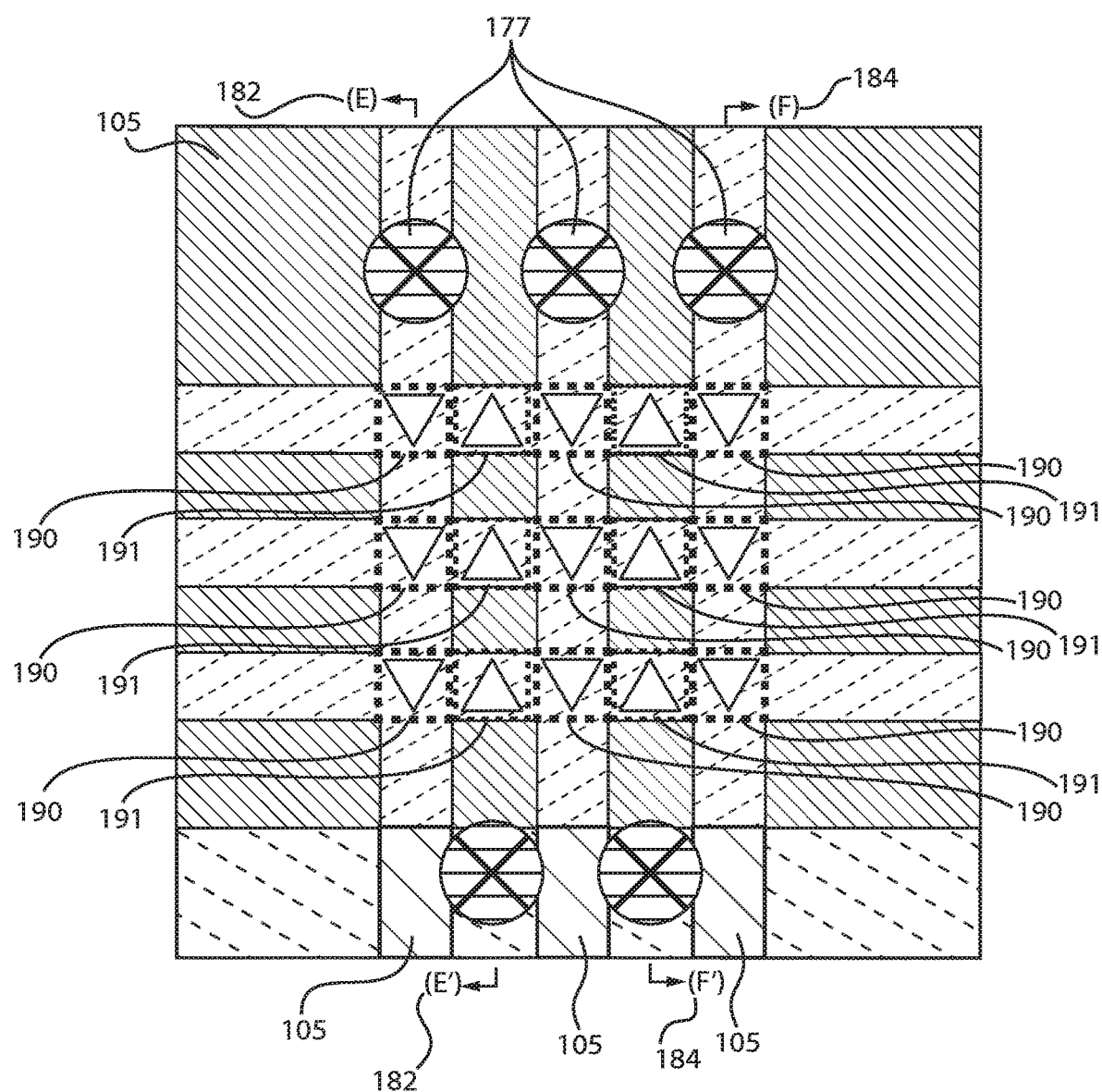
FIG. 15 is an additional top down view of the structure of FIG. 12, in accordance with an embodiment of the present invention.

FIG. 15 illustrates an additional top down view of the structure of FIG. 13, in accordance with example embodiments.

As shown in FIG. 15, the top down view 176 includes a EE' cross-sectional view 182 which, when viewed from E 182 to E' 182, shows that the higher bottom electrodes 115-H are formed on the substrate 105 (underlayer) and a contact 177 and top electrodes 130 (separated from the higher bottom electrodes 115-H by first high-k dielectric layers 125) are formed on the higher bottom electrodes 115-H. The second ILD 165 is formed between the contact 177 and the top electrodes 130 over the higher bottom electrodes 115-H and substrate 105.

Figure 16:
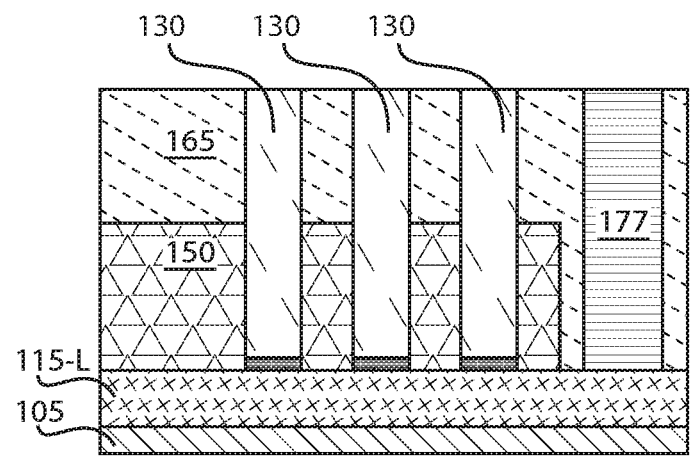
FIG. 16 are additional cross-sectional views of the structure of FIG. 14, in accordance with an embodiment of the present invention.
Figure 16:
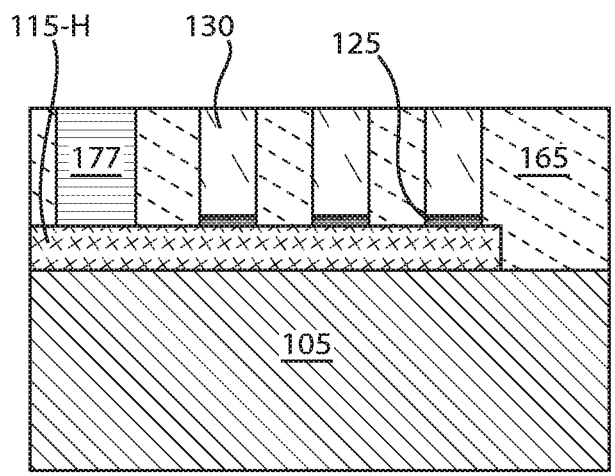

FIG. 16 illustrates additional cross-sectional views the structure of FIG. 13, in accordance with example embodiments.

FF' cross-sectional view 184 which, when viewed from F 184 to F' 184, shows that the lower bottom electrodes 115-L are formed on the substrate 105 (underlayer) and top electrodes 130 (separated from the lower bottom electrodes 115-L by first high-k dielectric layers 125) and a contact 177 are formed on the lower bottom electrodes 115-L. The first ILD 150 is formed around a lower portion of top electrodes 130 and the second ILD 165 is formed between the top electrodes 130 and the contact 7 and over the first ILD 150 and the higher bottom electrode(s) 115-H.

Figure 17:
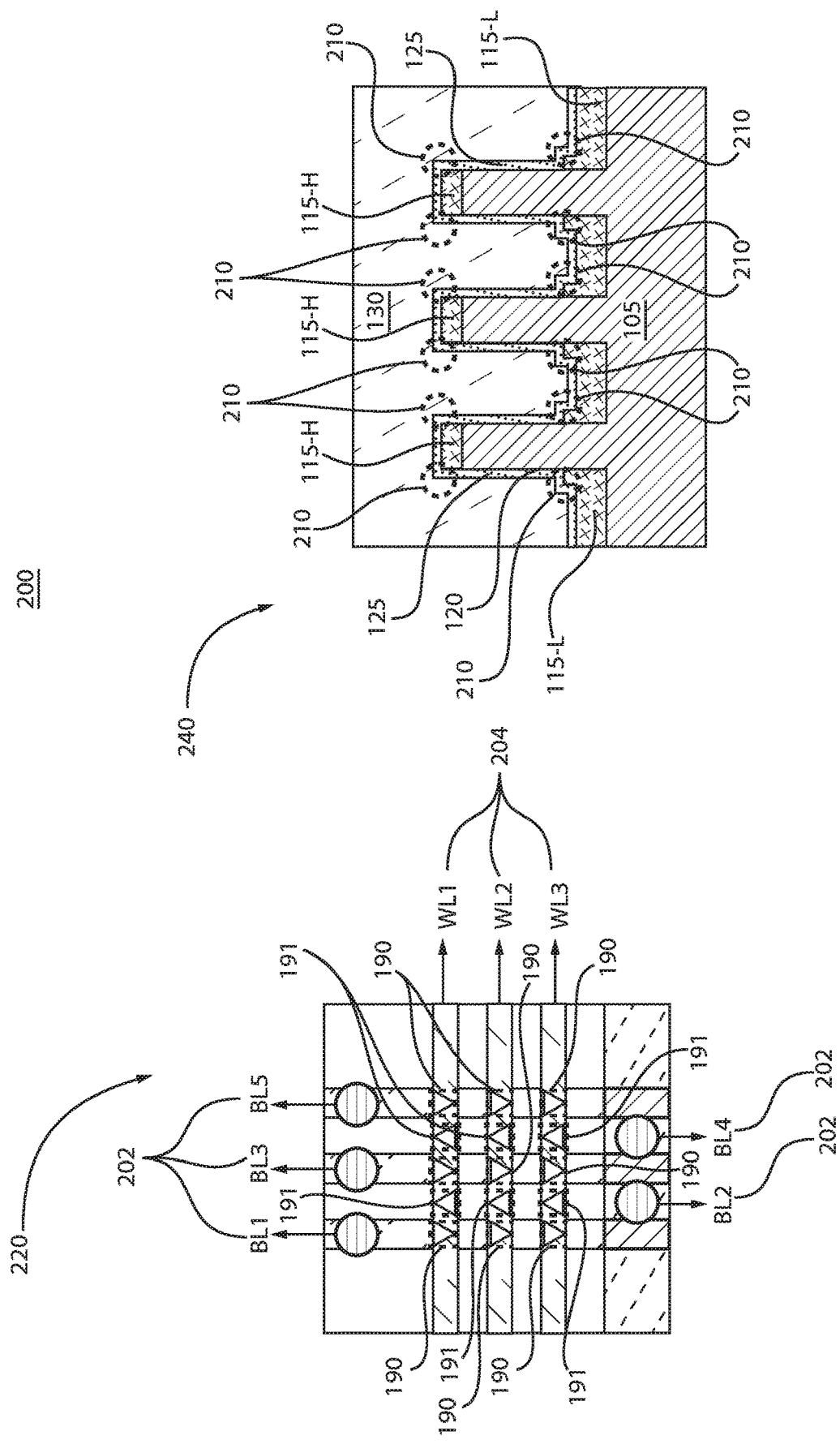
FIG. 17 includes top down and cross-sectional views showing confined filament formation at the corners between top electrode and bottom electrode, in accordance with an embodiment of the present invention.

FIG. 17 is a top down and cross-sectional view showing a semiconductor device 200 with confined filament formation at the corners between top electrode and bottom electrode, in accordance with example embodiments.

As shown in FIG. 17, particularly top down view 220, the resulting device includes bitlines 202 (shown as BL1 to BL5) and wordlines 204 (shown as WL1 to WL 3). As further shown in cross-sectional view 240, the processes described herein above result in confined filament formation at the (for example, sharp) corners 210 between top electrode 130 and bottom electrodes 115 (higher bottom electrodes 115-H and lower bottom electrodes 115-L). According to implementations, the processes form RRAM memory cells with cell density that is increased by 100% when compared to conventional RRAM memory cells. With regard to the real density of memory cells, incumbent processes for RRAM cell formation has a single bottom electrode (for example, an incumbent RRAM cell would have no 115-H terminal, but only 115-L, so the example embodiments double cell density (having both 115-H and 115-L presence) when compared with conventional memory cells.

The example embodiments direct filament formation to the preferred location for filament formation.

Figure 18:
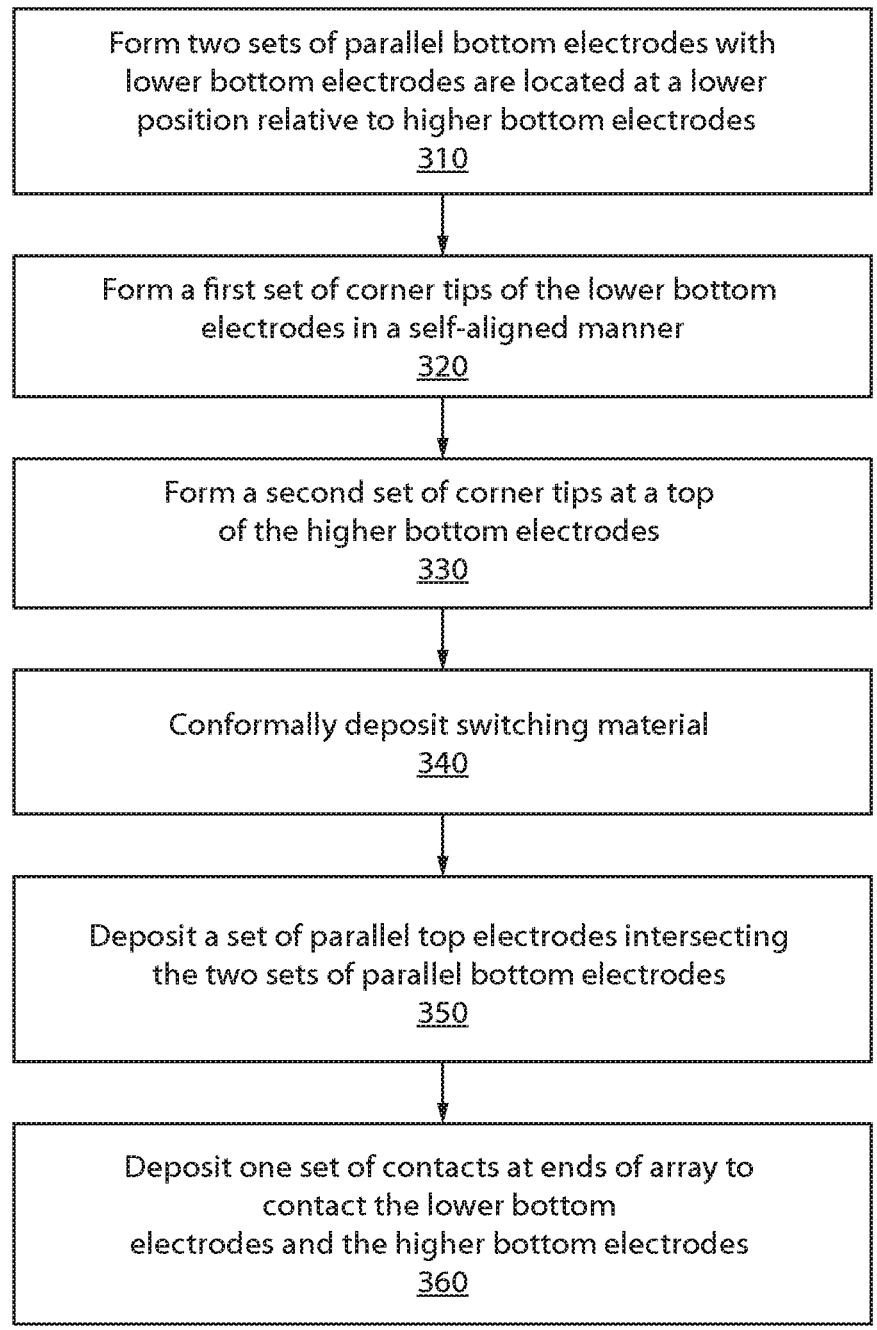
FIG. 18 is a flow diagram showing a method for forming a RRAM cell structure with filament confinement, in accordance with an embodiment of the present invention.

FIG. 18 is a flow diagram showing a method for forming a memory device with a crossbar array structure, in accordance with an example embodiment.

In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

At block 310, two sets of parallel bottom electrodes are formed on a substrate with lower bottom electrodes located at a lower position relative to higher bottom electrodes. Each set of parallel bottom electrodes are offset to each other.

At block 320, a first set of corner tips of the lower bottom electrodes is formed in a self-aligned manner with spacers and isotropic etching of the lower bottom electrodes. The self-aligned corner tips are formed using a semiconductor process flow technique that adds a protective dielectric layer over the lower bottom electrodes in order to prevent contact-to-gate shorts. Self-alignment allows aggressive scaling while minimizing yield loss due to misalignment and partial overlaps of the lower bottom electrodes. Both lower corner tips and upper corner tips are formed during directional etching while spacer at side wall exists (for example, sidewall spacer 120). Once the sidewall spacer 120 is removed, both sets of corner tips are exposed.

At block 330, a second set of corner tips is formed at a top of the higher bottom electrodes. The second set of corner tips is also formed in a self-aligned manner.

At block 340, conformal deposition of (for example, high-k) switching material. Accordingly, a filament formation region is determined at the self-aligned corner tips. Filaments formed with this structure will be confined to the area of the corner tips and thereby in a non-random manner. Switching layer corner tips formed (from the switching material which covers the electrodes) at the first set of self-aligned corner tips of the lower bottom electrodes and the second set of self-aligned corner tips are locations to which filament formation is directed during device operation.

At block 350, a set of parallel top electrodes is deposited intersecting the two sets of parallel bottom electrodes. A dielectric is formed as a resistive random-access memory (RRAM) cell under each intersection of each top electrode and each of bottom electrode.

At block 360, one set of contacts is deposited at one end of an array to contact the lower bottom electrodes and another set of contacts at the other end of the array to contact the higher bottom electrodes.

Filament formation can be implemented electrically after device fabrication is completed (for example, during operation of the device). The corner tip provides a favorable location for filament to form due to electric field enhancement. In contrast to incumbent structures in which filament formation is a random process, the sharp corner geometry of the example embodiments determines filament formation in a more controlled way, and improves RRAM device uniformity and yield, and also lowering forming voltage.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method for forming a memory device with a crossbar array structure (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a memory device, comprising:
    forming at least one set of self-aligned corner recesses at a plurality of first electrodes; and
    forming a resistive random-access memory (RRAM) cell at an intersection of each of a plurality of a self-aligned corner tips at a plurality of second electrodes with a corresponding self-aligned corner recess at the plurality of first electrodes to direct filament formations.

2. The method of claim 1, wherein the at least one set of the plurality of second electrodes includes two sets of parallel bottom electrodes on a substrate, wherein lower bottom electrodes are located at a lower position relative to higher bottom electrodes, further comprising:
    forming a first set of self-aligned corner tips of the lower bottom electrodes; and
    forming a second set of self-aligned corner tips at a top of the higher bottom electrodes.

3. The method of claim 2, wherein a first set of RRAM cells between the higher bottom electrodes and top electrodes and a second set of RRAM cells between the lower bottom electrodes and the plurality of first electrodes are formed in alternating columns in a first direction and in parallel columns in a perpendicular direction to the first direction.

4. The method of claim 1, wherein a resulting structure includes sets of self-aligned bitline contacts formed at minimal pitch.

5. The method of claim 1, further comprising:
enhancing an electric field at the intersection of each of the plurality of first electrodes and each of the plurality of second electrodes during an electroforming process.

6. The method of claim 1, wherein forming the RRAM cell at the intersection of each of the plurality of first electrodes and each of the plurality of second electrodes further comprises:
patterning dielectric trenches;
non-conformally depositing material for the plurality of second electrodes; and
etching back to remove the material from vertical surfaces, leaving the plurality of second electrodes on horizontal surfaces.

7. The method of claim 1, further comprising:
forming an orthogonal wordline and two sets of bitlines, wherein a high-k dielectric layer is positioned between wordline and bitline.

8. The method of claim 1, wherein the self-aligned corner tips are formed as sharp corners between the plurality of first electrodes and the plurality of second electrodes in a location conducive to filament formation that reduces variability of switching characteristics.

9. The method of claim 1, further comprising:
depositing a first interlayer dielectric deposition (ILD) material and performing chemical mechanical planarization (CMP);
recessing the first ILD material to expose the plurality of second electrodes enclosed in a dielectric layer; and
removing an exposed horizontal dielectric layer from the plurality of second electrodes.

10. The method of claim 9, further comprising:
depositing a second ILD material and performing chemical mechanical planarization (CMP); and
patterning contacts with vias to the plurality of second electrodes.

11. The method of claim 1, wherein the plurality of second electrodes include at least one of titanium-based materials, tantalum-based materials, and tungsten-based materials.

12. The method of claim 1, further comprising:
forming RRAM cells with a doubled density within a footprint area.

13. The method of claim 1, further comprising:
forming a memristor element of the RRAM cell from one of hafnium oxide, tantalum oxide, and titanium oxide.

14. The method of claim 1, further comprising:
depositing a switching layer, wherein switching layer corner tips formed at a first set of self-aligned corner tips of the plurality of second electrodes and at the second set of self-aligned corner tips are locations to which filament formation is directed during device operation.

15. A memory device with crossbar array structure, comprising:
a plurality of first electrodes with at least one set of self-aligned corner tips, wherein lower first electrodes are located at a lower position relative to higher first electrodes; and
a plurality of second electrodes intersecting the plurality of first electrodes, wherein a resistive random-access memory (RRAM) cell at an intersection of each of the at least one set of self-aligned corner tips of the plurality of first electrodes and each of a corresponding self-aligned corner recess of the plurality of second electrodes to direct filament formations.

16. The memory device of claim 15, wherein a resulting structure includes sets of bitline contacts formed at minimal pitch in a self-aligned manner.

17. The memory device of claim 15, wherein a first set of RRAM cells between the higher first electrodes and the plurality of second electrodes and a second set of RRAM cells between the lower first electrodes and the plurality of second electrodes are formed in alternating columns in a first direction and in parallel columns in a perpendicular direction to the first direction.

18. The memory device of claim 15, wherein a resulting structure includes an orthogonal wordline and two sets of bitlines, wherein a high-k dielectric layer is positioned between wordline and bitline.

19. The memory device of claim 15, wherein RRAM cells are formed with an increased density within a footprint area.

20. A memory device, comprising:
at least one set of self-aligned corner tips formed at the corners of a plurality of first electrodes;
switching layer corner tips formed at the first set of self-aligned corner tips of the plurality of first electrodes;
a plurality of second electrodes intersecting the plurality of first electrodes, wherein a dielectric is formed as a resistive random-access memory (RRAM) cell under each intersection of each of the at least one set of self-aligned corner tips of each first electrode and each of a corresponding self-aligned corner recess of the second electrode to direct filament formations; and
at least one set of contacts contacting the at least one set of electrodes.

* * * * *